US 6,629,012 B1

(12) United States Patent
Riley et al.

(10) Patent No.: US 6,629,012 B1
(45) Date of Patent: Sep. 30, 2003

(54) WAFER-LESS QUALIFICATION OF A PROCESSING TOOL

(75) Inventors: Terrence J. Riley, Austin, TX (US); Qingsu Wang, Austin, TX (US); Michael R. Conboy, Austin, TX (US); Michael L. Miller, Cedar Park, TX (US); W. Jarrett Campbell, Austin, TX (US)

(73) Assignee: Advanced Micro Devices Inc., Austin, TX (US)

( * ) Notice: Subject to any disclaimer, the term of this patent is extended or adjusted under 35 U.S.C. 154(b) by 0 days.

(21) Appl. No.: 09/479,403

(22) Filed: Jan. 6, 2000

(51) Int. Cl.⁷ .............................................. G06F 19/00
(52) U.S. Cl. .......................... 700/121; 700/30; 700/108
(58) Field of Search ........................ 700/30, 108, 109, 700/110, 121, 207, 209, 294; 702/130, 132, 134

(56) References Cited

U.S. PATENT DOCUMENTS

| 5,155,337 A | * 10/1992 | Sorrell et al. ................ 219/411 |
| 5,859,964 A | * 1/1999 | Wang et al. ................... 714/48 |
| 6,130,414 A | * 10/2000 | Toprac ......................... 219/497 |
| 6,136,388 A | * 10/2000 | Raoux et al. ................ 427/569 |
| 6,263,255 B1 | * 7/2001 | Tan et al. .................... 700/121 |

* cited by examiner

Primary Examiner—Leo Picard
Assistant Examiner—Chad Rapp
(74) Attorney, Agent, or Firm—Williams, Morgan & Amerson, P.C.

(57) ABSTRACT

A method for performing a wafer-less qualification of a processing tool includes creating a wafer-less qualification model for the processing tool. Qualification data is generated from the processing tool using a wafer-less qualification process. The qualification data is compared with the wafer-less qualification model. The processing tool is determined to be operating in a predefined state based on the comparison of the qualification data with the wafer-less qualification model.

34 Claims, 4 Drawing Sheets

WAFER-LESS QUALIFICATION OF A PROCESSING TOOL

BACKGROUND OF THE INVENTION

1. Field of the Invention

This invention relates generally to semiconductor processing, and, more particularly, to a method for wafer-less qualification of a processing tool.

2. Description of the Related Art

The technology explosion in the manufacturing industry has resulted in many new and innovative manufacturing processes. Today's manufacturing processes, particularly semiconductor manufacturing processes, call for a large number of steps that must be accurately executed to produce useful semiconductor devices. To maintain proper manufacturing control, a number of inputs are generally used to fine-tune the steps.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are significantly different from one another and specialized to the point that the processes may be readily performed in different manufacturing locations that contain different control schemes.

Among the factors that affect semiconductor device manufacturing are wafer-to-wafer variations that are caused by manufacturing problems that include start-up effects of manufacturing machine tools, memory effects of manufacturing chambers, and processing tool qualifications. One of the process steps adversely affected by such factors is rapid thermal processing (RTP) of semiconductor wafers.

Generally, rapid thermal processing (RTP) comprises quickly increasing the surface temperature of a wafer for short periods of time. For example, rapid thermal processing is used to thermally anneal a wafer, which generally takes place after an ion implantation process. During ion implantation, a surface of a wafer is bombarded with either N or P type dopant atoms, and as a result of the implantation, the crystal lattice of the semiconductor wafer may become damaged. The anneal step utilizes rapid thermal processing to recrystallize the silicon, which is required to produce functional semiconductor devices (e.g., memory, microprocessors, etc.) The wafer may be annealed by quickly ramping up to a desired processing temperature, holding the processing temperature for a desired period of time, and cooling the wafer back to room temperature in a matter of seconds. Although exact temperatures and times may vary depending upon the particular annealing process, the surface of the wafer may be heated to approximately 1000° C. for 5 to 30 seconds.

Rapid thermal processing may take place in a processing tool that is specially designed for high temperature processes. Such a processing tool is typically qualified, through a qualification process, to ensure the tool is operating in a predictable predetermined manner. Generally, it is desirable to subject production wafers to substantially the same manufacturing conditions, such that the resulting semiconductor devices (e.g., memory, microprocessors, etc.) have substantially the same performance characteristics (e.g., speed, power, etc.) Moreover, periodically subjecting the processing tool to a qualification process may be useful to ensure that the processing tool is operating in a predefined state. If it is determined from the qualification process that the processing tool is not operating as expected, the tool may be taken out of production and corrective action may be initiated.

One method currently used to qualify a rapid thermal processing tool is to process temperature sensitive monitor wafers (i.e., test wafers) through the processing tool and measure the post-process characteristics of the monitor wafers. Depending upon the particular process or the particular semiconductor devices being manufactured, the monitor wafers may be subjected to a variety of processing tool qualification recipes. For example, with high temperature processes (e.g., 1100° C. and above), the monitor wafers may be placed inside the rapid thermal processing tool and subjected to an oxide growth process. Once grown, the thickness of the oxide layer may be measured, and from this data, the current state of the processing tool may be determined. For example, the operating temperature of the processing tool may be approximated from the thickness of the oxide layer.

To qualify medium temperature processes (e.g., 800–1100° C.), the monitor wafers may be implanted with a dopant material, placed inside the rapid thermal processing tool, and partially annealed. Once partially annealed, the resistivity of the monitor wafers may be measured, and based on the collected data, the current state of the processing tool may be determined. For example, if the measured resistivity is less than an expected value, the processing tool may be operating too hot, and if the measured resistivity is greater than an expected value, the processing tool may be operating too cool.

Typically, rapid thermal processes are very sensitive to time and temperature. To ensure that the processing tool is operating within a predefined state, the processing tool may be qualified on a regular basis. For example, in one embodiment, the processing tool may be qualified every 24 hours. Alternatively, for critical processes, the processing tool may be qualified multiple times within a 24 hour period.

To produce accurate and reliable results, a qualification recipe may require many monitor wafers to be processed by the processing tool. Unfortunately, a typical monitor wafer may be used only once and must be discarded after a single use. The cost of these test wafers may be a large and substantial expense in semiconductor manufacturing. In addition, qualifying processing tools with monitor wafers introduces additional unnecessary external factors to the process, such as test wafer preparation, test wafer measurements, and nonuniformity between test wafers.

The present invention is directed to overcoming, or at least reducing the effects of, one or more of the problems set forth above.

SUMMARY OF THE INVENTION

In one aspect of the invention, a method for performing a wafer-less qualification of a processing tool is provided. The method includes creating a wafer-less qualification model for the processing tool. Qualification data is generated from the processing tool during a wafer-less qualification process. The qualification data is compared with the wafer-less qualification model. The processing tool is determined to be operating in a predefined state based on the comparison of the qualification data with the wafer-less qualification model.

In another aspect of the present invention, a system is provided. The system includes a processing tool, a plurality of measuring devices, and a process controller. The processing tool is adapted to being qualified using a wafer-less qualification process. The plurality of measuring devices are adapted to measure data during a wafer-less operation of the processing tool. The process controller is adapted to create a wafer-less qualification model of the processing tool, receive qualification data from the processing tool, compare the qualification data with the wafer-less qualification model, and determine if the processing tool is operating in a predefined state based on the comparison of the qualification data with the wafer-less qualification model.

BRIEF DESCRIPTION OF THE DRAWINGS

The invention may be best understood by reference to the following description taken in conjunction with the accompanying drawings, in which like reference numerals identify like elements, and in which.

Figure 1:
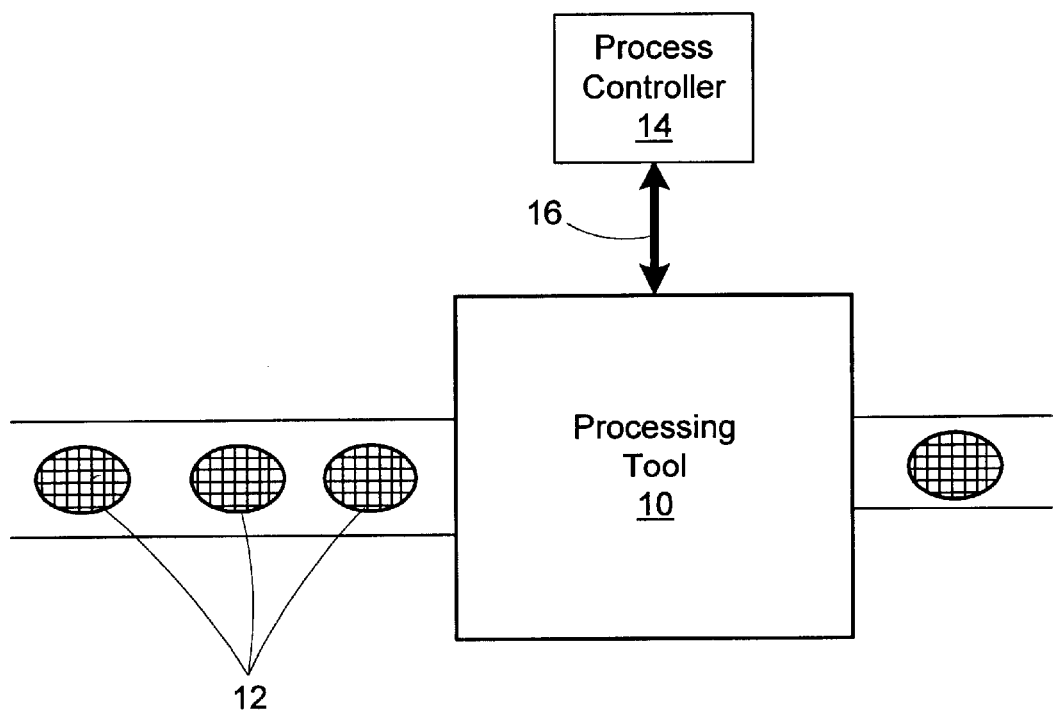
FIG. 1 is a simplified block diagram of a processing tool used to manufacture semiconductor devices.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Referring to FIG. 1, an exemplary processing tool 10 is shown. The processing tool 10 may be used as one part of an elaborate fabrication process to manufacture semiconductor wafers 12 into functional semiconductor devices. The processing tool 10 may be controlled by a process controller 14 that may send a plurality of control signals to the processing tool 10 on a control line 16. The process controller 14 may be comprised of a variety of devices. For example, in one embodiment, the process controller 14 may be a controller embedded inside the processing tool 10 and communicate with the processing tool 10 using protocols and interfaces provided by the manufacturer. Alternatively, the process controller 14 may be connected to a larger network of controllers and communicate with the processing tool 10 through an Advanced Process Control (APC) framework interface. For example, the processing tool 10 may be coupled to an equipment interface (not shown) that retrieves various operational data from the processing tool 10 and communicates this data to the Advanced Process Control (APC) framework to determine whether the processing tool 10 is experiencing a faulty operation or, as will be described below, whether the processing tool is operating as expected within a predefined state. The equipment interface may receive control signals from the APC framework that may be used to control the processing tool 10. For example, the control signal from the APC framework may be used to shut down the processing tool 10 if the tool state data (e.g., qualification data) that was sent by the equipment interface was deemed faulty by the APC framework.

The semiconductor wafers 12 are generally processed in batches, which are commonly referred to as lots or batch processing. For example, a lot of wafers 12 may be comprised of 25 wafers 12. The wafers 12 within a lot progress through the manufacturing process together in an attempt to subject the wafers 12 to substantially the same manufacturing conditions, such that the resulting semiconductor devices have substantially the same performance characteristics (e.g., speed, power, etc.) Generally, when the processing tool 10 permits, a lot of wafers 12 is process simultaneously, and the wafers 12 within the lot are subjected to substantially the same manufacturing conditions. However, a variety of processing tools 10, such as a rapid thermal processing tool, process the wafers 12 individually. For example, rather than simultaneously processing all the wafers 12 in a lot, each wafer 12 is successively and individually processed.

Figure 2:
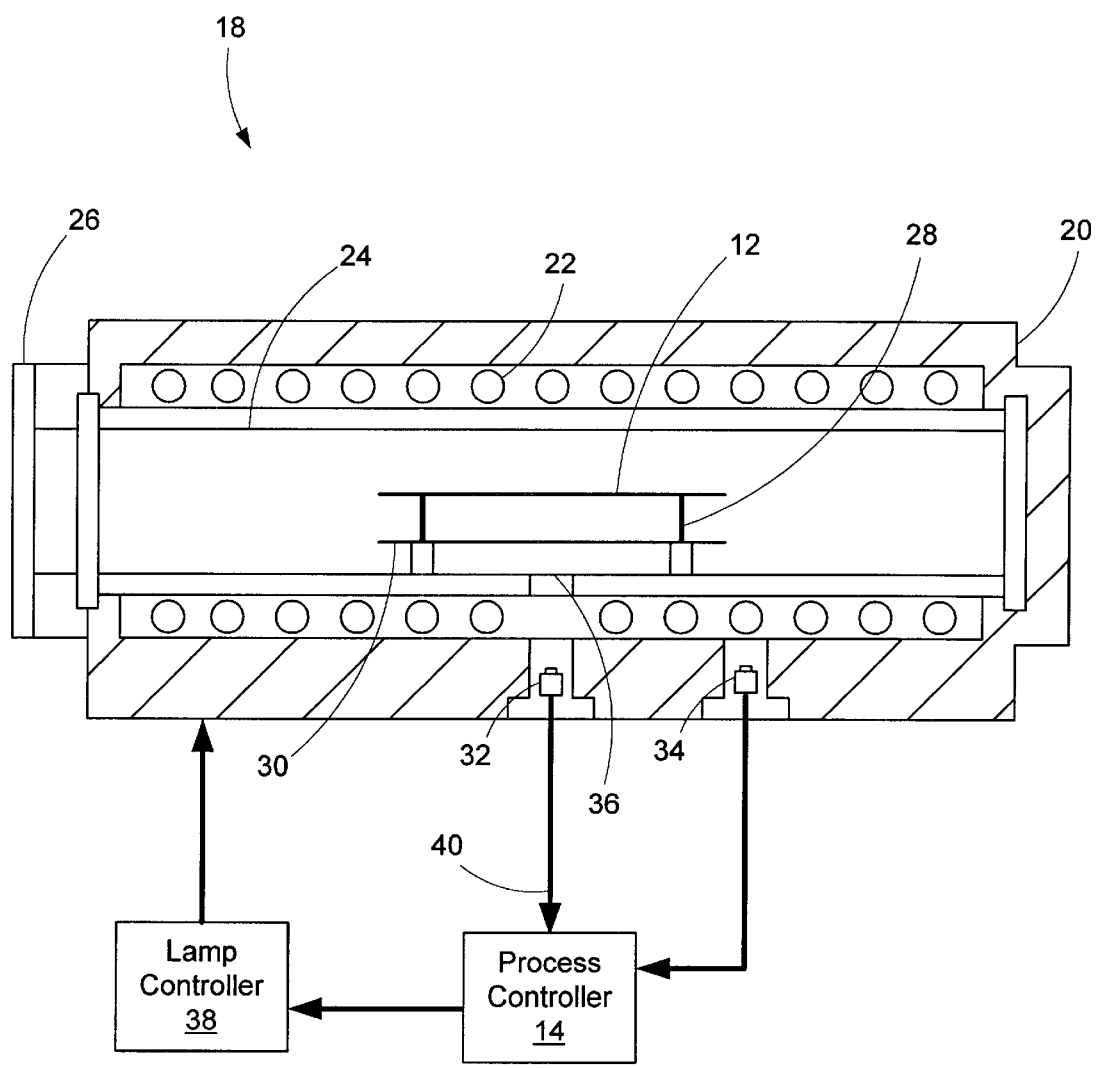
FIG. 2 is a cross-sectional view of an illustrative rapid thermal processing (RTP) tool.

Referring to FIG. 2, a cross-sectional view of an exemplary processing tool 18 is shown. In this illustrative embodiment, the processing tool 18 is used for rapid thermal processing of the semiconductor wafers 12. The processing tool 18 may be the SHS 2800 manufactured by AST Elektronik. The processing tool 18 may be comprised of a reactor block 20, heating elements 22, a reactor chamber 24, and a reactor chamber door 26. The heating elements 22 may be positioned adjacent to the reactor block 20 and may be comprised of a variety of devices, such as tungsten halogen lamps. Generally, rapid thermal processing comprises quickly increasing the surface temperature of a wafer 12 for short periods of time. The heating elements 22 may be used to provide heat to the reactor chamber 24. For example, in one embodiment the heating elements 22 provide heat in the form of radiation. Moreover, each heating element 22 may be independently and dynamically controlled to provide uniform and precise heating to the wafer 12 using radiation that passes through the reaction chamber 24.

The reactor chamber 24 separates the wafer 12 from the heating elements 22 and the reactor block 20, thus, providing a tightly controlled processing environment while minimizing the amount of contamination to which the wafer 12 is exposed. The reactor chamber 24 may be accessed through the reactor chamber door 26. As described above, the processing tool 18 may process each wafer 12 individually, and in this embodiment, each wafer 12 in a lot may be individually loaded into the processing tool 18, processed, and extracted from the processing tool 18, through the reactor chamber door 26.

The wafer 12 is processed inside the reactor chamber 24 and is positioned on quartz pins 28 attached to a quartz wafer tray (not shown), which resides inside the reactor chamber 24. A permanent wafer 30 may be positioned underneath the wafer 12, and the permanent wafer 30 may be a HotLiner™, which is a silicon nitride coated silicon wafer. As will be discussed below, the permanent wafer 30 insures that the temperature of the wafer 12 is measured accurately.

A variety of parameters (e.g., various tool state data) of the processing tool 18 may be monitored to determine the current state of the processing tool 18. Moreover, a variety of sensors and devices may be used to extract the data, and this data may be sent to the process controller 14. In one illustrative embodiment, a first and second pyrometer 32, 34 are shown positioned within the reactor block 20. The first pyrometer 32 may be used to measure the temperature of the wafer 12 or the permanent wafer 30, and the second pyrometer 34 may be used to measure the temperature of the reactor chamber 24. Those skilled in the art will appreciate that the pyrometers 32, 34 are non-intrusive measuring devices that do not contact the wafer 12 or the reactor chamber 24. Rather, the pyrometers 32, 34 are optical instruments that measure temperature by light input. Once calibrated, the pyrometers 32, 34 deliver an electrical signal that correlates with the amount of light intensity that enters it, which correlates with the temperature of the object the pyrometers 32, 34 view.

The first pyrometer 32 measures the temperature of the wafer 12 through a window 36. The window 36 permits the first pyrometer 32 to "look" into the reactor chamber 24 and determine the temperature of the wafer 12 from the permanent wafer 30. If the permanent wafer 30 was not used, the first pyrometer 32 may give false temperature measurements because the backside film layer of the wafer 12 may vary depending upon the process, and the various film layers each give off different emissions in response to temperature. Because the coating of the permanent wafer 30 remains the same, the first pyrometer 32 may be calibrated with its emitted radiation. The second pyrometer 34 operates in substantially the same manner but operates to measure the temperature of the reactor chamber 24. For example, the second pyrometer 34 is directed at the outer surface of the reactor chamber 24.

Although only two pyrometers 32, 34 are shown, those skilled in the art will appreciate that a plurality of pyrometers 32, 34 may be used to determine the temperature of the wafer 12 and reactor chamber 24. Moreover, rather than using the pyrometers 32, 34, any other measuring devices may be used, such as a thermocouple, etc. Furthermore, the number and particular type of measuring devices may vary, depending upon the application.

In one embodiment, a lamp controller 38 may be used to "drive" the heating elements 22 during operation of the processing tool 18. Generally, for a particular process, a specific operating temperature may be desired. With this in mind, the process controller 14 may receive temperature measurements (e.g., tool state data) from the first and second pyrometers 32, 34 over the data lines 40. Based on the tool state data, the process controller 14 may direct the lamp controller 38 to increase or decrease the power supplied to the heating elements 22. For example, if the temperature inside the reactor chamber 24 needs to be increased, more power may be supplied to the heating elements 22. Likewise, if the temperature inside the reactor chamber 24 needs to be decreased, the power supplied to heating elements 22 may be reduced.

In one embodiment, power consumption of the heating elements 22 may be monitored by the process controller 14 and included in the tool state data of the processing tool 18. For example, when power is supplied to the heating elements 22 (e.g., during pre-heat, normal operation, etc.), the process controller 14 may determine whether the processing tool 18 is operating at 50%, 75%, or any other percentage of full power. Alternatively, the process, controller 14 may monitor power consumption of the processing tool 18 in terms of watts. In one embodiment, during operation of the processing tool 10, the power consumption of heating elements 22 may be sent to a data output device (not shown), such as a display, a data file, and the like.

In addition to power consumption, the tool state data may include incremental changes, such as increases or decreases, in the power supplied to the heating elements 22. As described above, to maintain a desired operating temperature, the process controller 14 may direct the lamp controller 38 to increase or decrease the power supplied to the heating elements 22. These incremental changes may be monitored by the process controller 14 and included in the tool state data of the processing tool 18.

Figure 3:
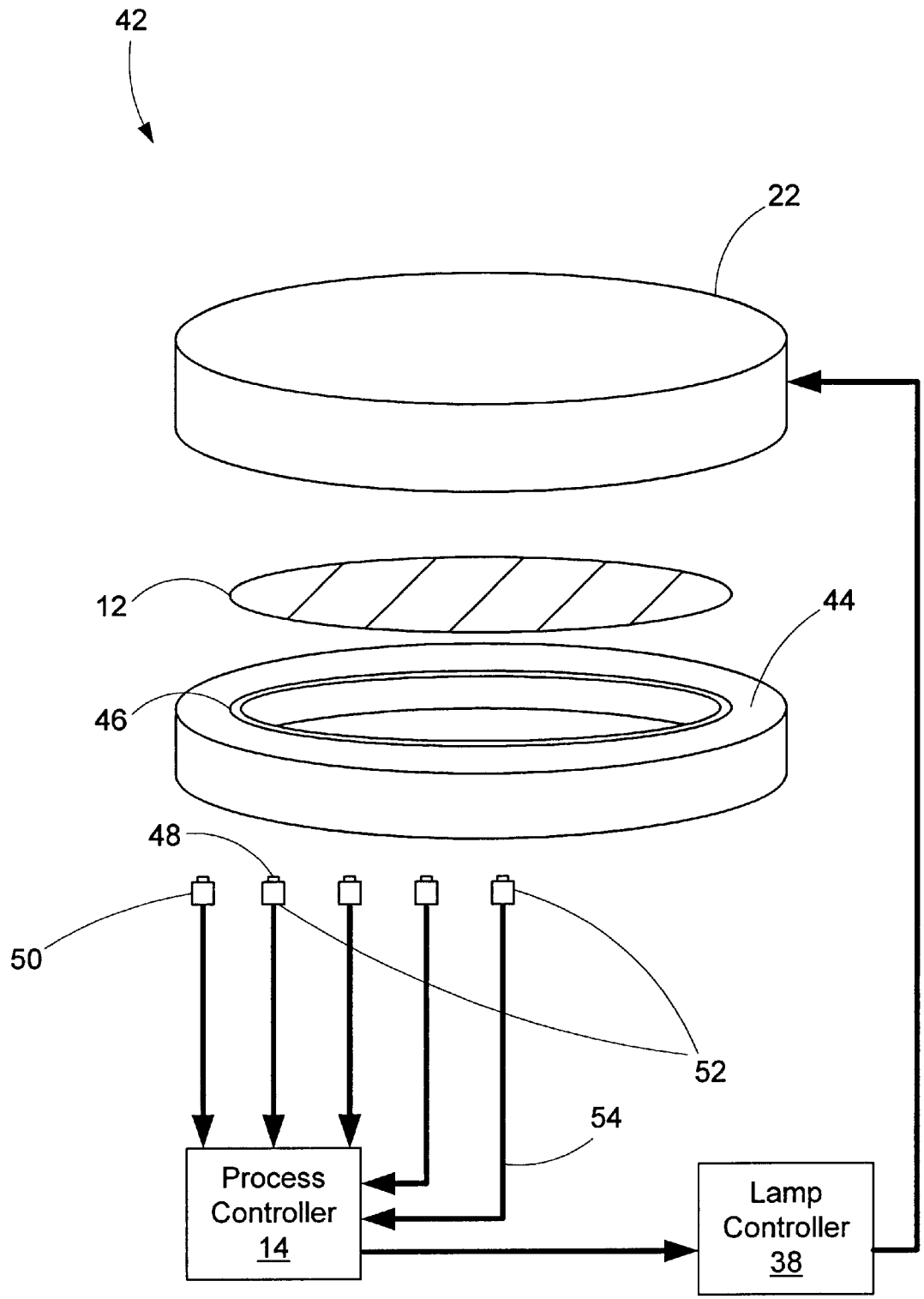
FIG. 3 is a simplified exploded view of a second illustrative embodiment of a rapid thermal processing (RTP) tool.

Referring to FIG. 3, a second exemplary processing tool 42 used for rapid thermal processing of semiconductor wafers 12 is shown. Those skilled in the art will appreciate that FIG. 3 is a simplified view and that the surrounding structure of the processing tool 42 is not shown to avoid unnecessarily obscuring the invention. In one embodiment, the processing tool 42 may be a rapid thermal processing tool manufactured by Applied Materials.

In this illustrative embodiment, a ring 44 supports the wafer 12 inside the processing tool 42. The ring 44 may include a recess 46 that contacts the outer edge of the wafer during processing, and the ring 44 may rotate while processing the wafer 12, which may result in a more even temperature distribution across the wafer 12. The ring 44 may be comprised of a variety of materials, and in one embodiment, the ring 44 is comprised of silicon carbide coated with silicon.

A heating element 22 may be positioned above the ring 44. Those skilled in the art will appreciate that the heating element 22 may be comprised of a variety of devices, such as a tungsten halogen lamp assembly. Moreover, the heating element 22 may be comprised of a plurality of individual lamp assemblies, which may be controlled in groups of circular lamp zones, and the rotation of the ring 44 and the wafer 12 may be used to smooth lamp to lamp variations and provide more even heating across the wafer 12.

A plurality of temperature probes 48 (e.g., pyrometers) may be positioned below the support ring 44. The pyrometers 48 may "look" into the processing tool 42 through openings (not shown) and monitor the temperature of the wafer 12 being processed, the temperature of the ring 44, or any other object that is "viewable" by the pyrometers 48. For example, in one embodiment, when the wafer 12 is positioned on the ring 44, an outer pyrometer 50 may be directed at the ring 44 while a first group of pyrometers 52 are spaced apart and directed at the wafer 12. The outer pyrometer 50 may monitor the temperature of the ring 44 and possibly the outer most edge of the wafer 12 while the first group of pyrometers 52 monitors the temperature of the wafer 12. When the wafer 12 is removed from the ring 44, the outer pyrometer 50 remains directed at the ring 44 while the first group of pyrometers 52 "looks" through the ring 44 and is directed at the heating element 22. Thus, with the wafer 12 removed, the first group of pyrometers 52 may directly observe the temperature of the heating element 22.

The pyrometers 48 may be coupled to the process controller 14 over data lines 54. As described above, the lamp controller 38 may be used to "drive" the heating element 22 during operation of the processing tool 42. For example, if the temperature inside the reactor chamber 24 needs to be increased, more power may be supplied to the heating elements 22. Likewise, if the temperature inside the reactor chamber 24 needs to be decreased, the power supplied to heating elements 22 may be reduced. The power consumption of the heating elements 22 may be monitored by the process controller 14 and included in the tool state data of the processing tool 42.

The processing environment of the processing tool 42 may also be monitored and included in the tool state data of the processing tool 42. For example, in one embodiment, the process gas type, gas flow rates and other such variables may be used to represent the process environment of the processing tool 42. Moreover, the composition of the process gas may be monitored as it exits the processing tool 42. For example, in one illustrative embodiment, the oxygen concentration level of the process gas may be monitor using optical emission spectroscopy. Once measured, the processing environment data may be received by the process controller 14 and included in the tool state data of the processing tool 42.

Figure 4:
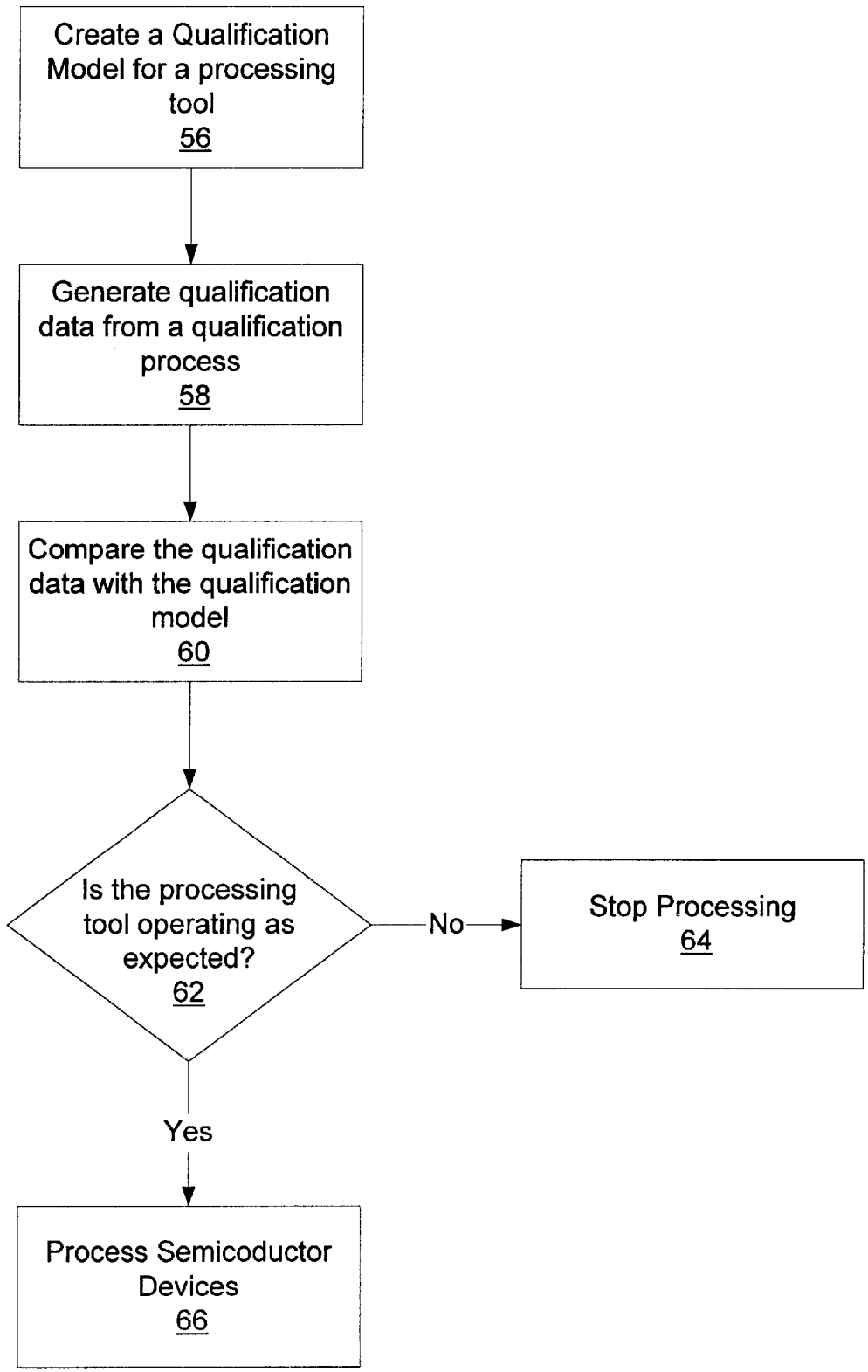
FIG. 4 illustrates a flowchart representation of the methods taught by the present invention.

Referring to FIG. 4, a flowchart depiction of one embodiment of the present invention is illustrated. At block 56, a qualification model for the processing tools 18, 42, illustrated in FIGS. 2 and 3 respectively, may be created. The qualification model may be generated by observing data that is repeatable under known conditions. For example, when the processing tools 18, 42 are operating in a desired state, model data may be observed and recorded. Once observed, the model data may be used to create a qualification model, which may be subsequently compared against data observed during a qualification process to determine whether the processing tools 18, 42 are operating within the desired state. Furthermore, a plurality of qualification models may be created, recorded, and subsequently recalled by the process controller 14, and the particular qualification model subsequently recalled by the process controller 14 may vary as a matter of design choice. For example, the qualification model recalled may vary depending upon a particular manufacturing process, a particular processing tool, a particular semiconductor device being manufactured, or the like.

The model data may be comprised of a plurality process parameters, which may be observed by operating the processing tools 18, 42 in a wafer-less state. For example, the model data may be comprised of reaction chamber temperatures, permanent wafer temperatures, ring temperatures, lamp powers, lamp temperatures, processing environment data or any other wafer-less operating parameter that is determined to be relevant to creating the qualification model. The model data may be generated from a variety of operating routines, such as a standard process recipe typically used to process a semiconductor wafer 12 or from a special process recipe that is designed to generate the qualification model and to qualify the processing tools 18, 42. For example, because the permanent wafer 30 remains inside the processing tool 18, illustrated in FIG. 2, when generating the qualification model, the processing tool 18 may be better adapted to a standard process recipe. Alternatively, because only the ring 44 remains inside the processing tool 42, illustrated in FIG. 3, when generating the qualification model, the processing tool 42 may be better adapted to a special process recipe. For example, because the first group of pyrometers 52 is directed at the heating element 22, the processing tool 42 may be qualified using a special process recipe that operates at a lower temperature. In another embodiment, only the outer pyrometer 50 may be used to represent the temperature inside the processing tool 42. Moreover, the pyrometers 48 may be directed at any object inside the processing tool 42 that is adapted to generating repeatable data. With either method, by continually operating the processing tools 18, 42 in a wafer-less state, model data may be observed, which may accurately represents a desirable predefined state of the processing tools 18, 42, thus eliminating the need for monitor wafers (not shown).

Once a qualification model is created that represents a known state of the processing tools 18, 42, an incremental perturbation may be purposely introduced to the processing tools 18, 42, and disturbance data that reflects the perturbation to the processing tools 18, 42 may be observed and recorded. Once observed, the disturbance data may be added to the qualification model, and if the processing tools 18, 42 are later determined to be operating outside the qualification model, the disturbance data may be used to determine how far outside the qualification model the processing tools 18, 42 are operating. For example, one incremental change that may be made is increasing or decreasing the operating temperature of the processing tools 18, 42. By incrementally changing the operating temperature and recording the disturbance data that reflects this change, the qualification model may reflect whether the actual operating temperature of the processing tools 18, 42 is 1° C., 100° C., or some other temperature away from the desired operating temperature. Generally, any number of disturbances may be introduced to the processing tools 18, 42. For example, the power supplied to the heating element 22 may be increased or decreased, debris may be placed in proximity to the pyrometers 48, or any other perturbation that may fluctuate the operation of the processing tools 18, 42.

At block 58, qualification data may be generated from the processing tools 18, 42 during a qualification process. As described above, a variety of wafer-less operating routines may be used to generate the qualification data. For example, a standard process recipe typically used to process a semiconductor wafer 12 may be used to generate the qualification data. Alternatively, a special process recipe may be used to generate the qualification data. Typically, the same process recipe used to create the qualification model is used to generate the qualification data.

Once the qualification data is observed, at block 60, the qualification data may be compared with the qualification model to determine whether the processing tools 18, 42 are operating within a predefined state. Furthermore, if the processing tools 18, 42 are not operating as expected, the qualification data may be compared with the disturbance data within the qualification model to determine how far outside the qualification model the processing tools 18, 42 are operating. For example, from the qualification model, it may be determined whether the actual operating temperature of the processing tools 18, 42 is 1° C., 100° C., or some other temperature away from the desired operating temperature. In one embodiment, the qualification data is compared with the qualification model automatically by the process controller 14. Alternatively, the qualification data may be manually compared with the appropriate qualification model by a technician operating the processing tools 18, 42.

At block 62, based on the comparison of the qualification data with the qualification model, the processing tools 18, 42 are determined whether to be operating in an acceptable predefined state. As described above, if the processing tools 18, 42 are operating outside of the qualification model, the qualification data may be compared with disturbance data to determine whether the processing tools 18, 42 are operating within acceptable limits for the particular process. Those skilled in the art will appreciate that acceptable operational limits of a processing tool may vary depending upon the particular process.

At block 64, if the processing tools 18, 42 are determined to be operating in an unacceptable manner, the processing tools 18, 42 may be taken out of production and corrective action may be initiated. In one embodiment, the process controller 14 may automatically stop the processing tools 18, 42 from processing and generate an alert signal to be received by a technician. For example, the process controller 14 may generate an audible signal, an email, or any other type of notification. In another embodiment, the process controller 14 may determine that the processing tools 18, 42 are operating just within an acceptable range of operation. In this case, rather than shutting down the processing tools 18, 42, the process controller 14 may generate the alert signal only, thus, bring attention to a possible problem with the processing tools 18, 42 while continuing to process the current lot of wafers 12. Alternatively, at block 66, if the processing tools 18, 42 are determined to be operating as expected, the processing tools 18, 42 may continue processing semiconductor wafers 12.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for performing a wafer-less qualification of a processing tool, comprising:
   creating a wafer-less qualification model for the processing tool;
   generating qualification data from the processing tool during a wafer-less qualification process;
   comparing the qualification data with the wafer-less qualification model; and
   determining if the processing tool is operating in a predefined state based on the comparison of the qualification data with the wafer-less qualification model.

2. The method of claim 1, wherein creating the wafer-less qualification model comprises:
   operating the processing tool in a wafer-less predefined state;
   observing model data during the wafer-less operation of the processing tool; and
   generating the wafer-less qualification model from the model data.

3. The method of claim 2, wherein operating the processing tool in a wafer-less predefined state comprises:
   operating the processing tool using a standard process recipe.

4. The method of claim 2, wherein operating the processing tool in a wafer-less predefined state comprises:
   operating the processing tool using a special process recipe that is adapted for generating the wafer-less qualification model.

5. The method of claim 2, wherein observing the model data comprises:
   observing at least one of a reaction chamber temperature, a permanent wafer temperature, a ring temperature, a heating element power, processing environment data, and a heating element temperature.

6. The method of claim 1, wherein creating the wafer-less qualification model comprises:
   introducing an incremental perturbation to a wafer-less operation of the processing tool;
   observing disturbance that reflects the incremental perturbation to the processing tool; and
   adding the disturbance data to the wafer-less qualification model.

7. The method of claim 6, further comprising:
   comparing the qualification data with the disturbance data if the processing tool is not operating in the predefined state; and
   determining how far outside the predefined state the processing tool is operating based on the comparison of the qualification data with the disturbance data.

8. The method of claim 7, further comprising:
   shutting down the processing tool in response to the processing tool operating too far outside an acceptable predetermined range.

9. The method of claim 7, further comprising:
   generating an alert signal in response to the processing tool operating too far outside an acceptable predetermined range.

10. The method of claim 1, wherein generating the qualification data comprises:
    operating the processing tool using a wafer-less qualification process that is substantially the same as a processing recipe used to create the wafer-less qualification model; and
    observing the qualification data during the wafer-less qualification process.

11. The method of claim 1, wherein determining if the processing tool is operating in a predefined state comprises:
    sending and receiving data to and from an Advanced Process Controller (APC).

12. The method of claim 1, further comprising:
    shutting down the processing tool in response to the processing tool not operating within the predefined state.

13. The method of claim 1, further comprising:
    generating an alert signal in response to the processing tool not operating within the predefined state.

14. The method of claim 1, further comprising processing a wafer in the processing tool responsive to determining the processing tool is operating in the predefined state.

15. A system comprising:
    a processing tool adapted to being qualified using a wafer-less qualification process;
    a plurality of measuring devices that are adapted to measure data during a wafer-less operation of the processing tool;
    a process controller that is adapted to create a wafer-less qualification model of the processing tool, receive qualification data from the processing tool, compare the qualification data with the wafer-less qualification model, and determine if the processing tool is operating in a predefined state based on the comparison of the qualification data with the wafer-less qualification model.

16. The system of claim 15 wherein the process controller is adapted to receive distubance data that reflects incremental perturbations to a wafer-less operation of the processing tool and add the disturbance data to the wafer-less qualification model.

17. The system of claim 16, wherein the process controller is adapted to compare the qualification data with the disturbance data if the processing tool is not operating in the predefined state and determine how far outside the predefined state the processing tool is operating based on the comparison of the qualification data with the disturbance data.

18. The system of claim 17, wherein the process controller is adapted to shut down the processing tool in response to the processing tool operating too far outside an acceptable predetermined range.

19. The system of claim 17, wherein the process controller is adapted to generate an alert signal in response to the processing tool operating too far outside an acceptable predetermined range.

20. The system of claim 15, wherein the process controller is an Advanced Process Controller (APC) that is coupled to an Advanced Process Control framework.

21. The system of claim 15, wherein the process controller is adapted to shut down the processing tool in response to the processing tool not operating within the predefined state.

22. The system of claim 15, wherein the process controller is adapted to generate an alert signal in response to the processing tool not operating within the predefined state.

23. The system of claim 15, wherein the processing tool is adapted to process a wafer responsive to the process controller determining the processing tool is operating in the predefined state.

24. A computer readable program storage device encoded with instructions that, when executed by a computer, performs a method for a wafer-less qualification of a processing tool in a manufacturing process, comprising:
  creating a wafer-less qualification model for the processing tool;
  generating qualification data for the processing tool from a wafer-less qualification process;
  comparing the qualification data with the wafer-less qualification model; and
  determining if the processing tool is operating in a predefined state based on the comparison of the qualification data with the wafer-less qualification model.

25. The computer readable program storage device encoded with instructions that, when executed by a computer, performs the method described in claim 24, wherein creating the wafer-less qualification model comprises:
  operating the processing tool in a wafer-less predefined state;
  observing model data from the wafer-less operation of the processing tool; and
  generating the wafer-less qualification model from the model data.

26. The computer readable program storage device encoded with instructions that, when executed by a computer, performs the method described in claim 24, wherein creating the wafer-less qualification model comprises:
  introducing an incremental perturbation to a wafer-less operation of the processing tool;
  observing disturbance that reflects the incremental perturbation to the processing tool; and
  adding the disturbance data to the wafer-less qualification model.

27. The computer readable program storage device encoded with instructions that, when executed by a computer, performs the method described in claim 26, further comprising:
  comparing the qualification data with the disturbance data if the processing tool is not operating in the predefined state; and
  determining how far outside the predefined state the processing tool is operating based on the comparison of the qualification data with the disturbance data.

28. The computer readable program storage device encoded with instructions that, when executed by a computer, performs the method described in claim 27, further comprising:
  shutting down the processing tool in response to the processing tool operating too far outside an acceptable predetermined range.

29. The computer readable program storage device encoded with instructions that, when executed by a computer, performs the method described in claim 27, further comprising:
  generating an alert signal in response to the processing tool operating too far outside an acceptable predetermined range.

30. The computer readable program storage device encoded with instructions that, when executed by a computer, performs the method described in claim 27, further comprising:
  generating an alert signal in response to the processing tool not operating within the predefined state.

31. The computer readable program storage device encoded with instructions that, when executed by a computer, performs the method described in claim 24, wherein generating the qualification data further comprises:
  operating the processing tool using a wafer-less qualification process that is substantially the same as a processing recipe used to create the wafer-less qualification model; and
  observing the qualification data during the wafer-less qualification process.

32. The computer readable program storage device encoded with instructions that, when executed by a computer, performs the method described in claim 24, further comprising:
  shutting down the processing tool in response to the processing tool not operating within the predefined state.

33. The computer readable program storage device encoded with instructions that, when executed by a computer, performs the method described in claim 24, further comprising:
  directing the processing tool to process a wafer responsive to determining the processing tool is operating in the predefined state.

34. A system comprising:
  means for creating a wafer-less qualification model for a processing tool;
  means for generating qualification data for the processing tool from a wafer-less qualification process;
  means for comparing the qualification data with the wafer-less qualification model; and
  means for determining if the processing tool is operating in a predefined state based on the comparison of the qualification data with the wafer-less qualification model.

* * * * *